(12) United States Patent
Robinson et al.

(10) Patent No.: US 11,681,227 B2
(45) Date of Patent: Jun. 20, 2023

(54) ENHANCED EUV PHOTORESIST MATERIALS, FORMULATIONS AND PROCESSES

(71) Applicants: Alex P. G. Robinson, Birmingham (GB); Carmen Popescu, Birmingham (GB); John Roth, Cohasset, MA (US); Andreas Frommhold, Gera (DE); Edward Jackson, Franklin, MA (US); Alexandra McClelland, Worcester (GB); Tom Lada, Somerville, MA (US); Greg O'Callahan, Birmingham (GB)

(72) Inventors: Alex P. G. Robinson, Birmingham (GB); Carmen Popescu, Birmingham (GB); John Roth, Cohasset, MA (US); Andreas Frommhold, Gera (DE); Edward Jackson, Franklin, MA (US); Alexandra McClelland, Worcester (GB); Tom Lada, Somerville, MA (US); Greg O'Callahan, Birmingham (GB)

( * ) Notice: Subject to any disclaimer, the term of this patent is extended or adjusted under 35 U.S.C. 154(b) by 413 days.

(21) Appl. No.: 16/284,069

(22) Filed: Feb. 25, 2019

(65) Prior Publication Data
US 2020/0272050 A1 Aug. 27, 2020

(51) Int. Cl.
| | |
|---|---|
| *G03F 7/40* | (2006.01) |
| *G03F 7/38* | (2006.01) |
| *G03F 7/023* | (2006.01) |
| *G03F 7/038* | (2006.01) |
| *G03F 7/004* | (2006.01) |

(Continued)

(52) U.S. Cl.
CPC ............. *G03F 7/40* (2013.01); *G03F 7/0045* (2013.01); *G03F 7/0212* (2013.01); *G03F 7/0233* (2013.01); *G03F 7/038* (2013.01); *G03F 7/0382* (2013.01); *G03F 7/70033* (2013.01)

(58) Field of Classification Search
CPC ......... G03F 7/039; G03F 7/0392; G03F 7/38; G03F 7/40; G03F 7/038; G03F 7/0382; G03F 7/0045
See application file for complete search history.

(56) References Cited

U.S. PATENT DOCUMENTS

| | | | | | |
|---|---|---|---|---|---|
| 4,404,205 | A | * | 9/1983 | Kokosi ............... | C07D 487/04 514/214.02 |
| 5,693,452 | A | * | 12/1997 | Aoai .................. | G03F 7/0045 430/270.1 |

(Continued)

*Primary Examiner* — John S Chu
(74) *Attorney, Agent, or Firm* — James G. Shelnut; The Patent Practice of Szmanda and Shelnut LLC

(57) ABSTRACT

The present disclosure relates to novel negative-type photoresist composition and methods of their use. The disclosure further relates to multiple trigger photoresist processes which allow for the improvement in contrast, resolution, and/or line edges roughness in some systems without giving up sensitivity. The photoresist compositions and the methods of the current disclosure are ideal for fine patent processing using, for example, ultraviolet radiation, extreme ultraviolet radiation, beyond extreme ultraviolet radiation, X-rays and changed particle. The disclosure further relates to sensitivity enhancing materials useful in the disclosed compositions and methods.

7 Claims, 11 Drawing Sheets

(51) Int. Cl.
*G03F 7/021* (2006.01)
*G03F 7/00* (2006.01)

(56) References Cited

U.S. PATENT DOCUMENTS

| | | | |
|---|---|---|---|
| 8,088,564 B2* | 1/2012 | Abdallah | G03F 7/0392 |
| | | | 430/323 |
| 9,122,156 B2* | 9/2015 | Robinson | G03F 7/0382 |
| 9,229,322 B2* | 1/2016 | Robinson | G03F 7/0045 |
| 9,519,215 B2* | 12/2016 | Robinson | G03F 7/0382 |
| 2012/0208125 A1* | 8/2012 | Hatakeyama | G03F 7/0043 |
| | | | 430/281.1 |
| 2017/0285482 A1* | 10/2017 | Tsuchihashi | G03F 7/38 |

* cited by examiner

| -alkyl- | -aryl- | -O- | -COO- |
|---|---|---|---|
| j | k | p | q |
| 1 | 1 | 1 | 1 |
| 1 | 1 | 0 | 1 |
| 1 | 1 | 1 | 0 |
| 1 | 0 | 0 | 1 |
| 1 | 0 | 1 | 0 |
| 0 | 1 | 1 | 1 |
| 0 | 1 | 0 | 1 |
| 0 | 1 | 1 | 0 |
| 0 | 0 | 0 | 1 |

Fig. 1

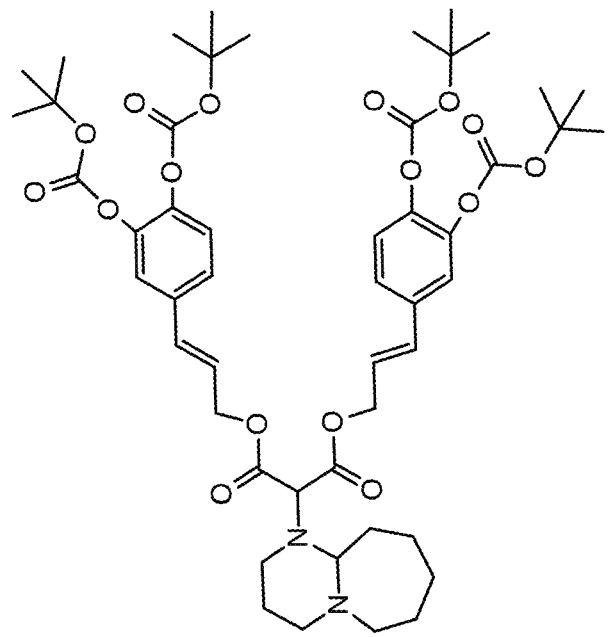
Fig. 2B
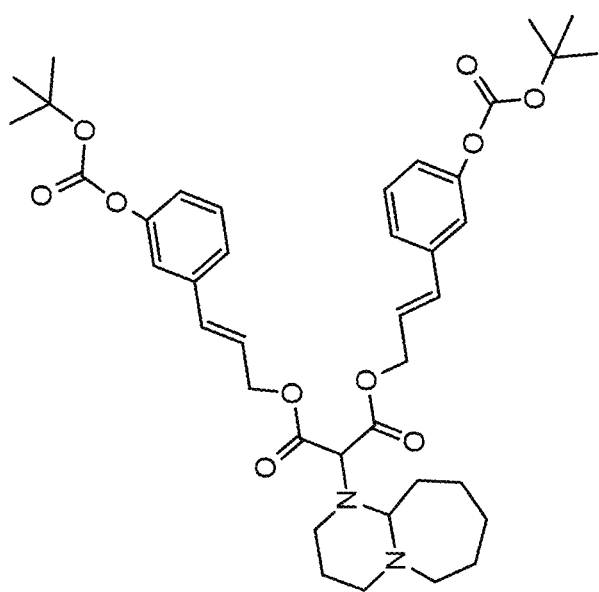
Fig. 2A
Fig. 2

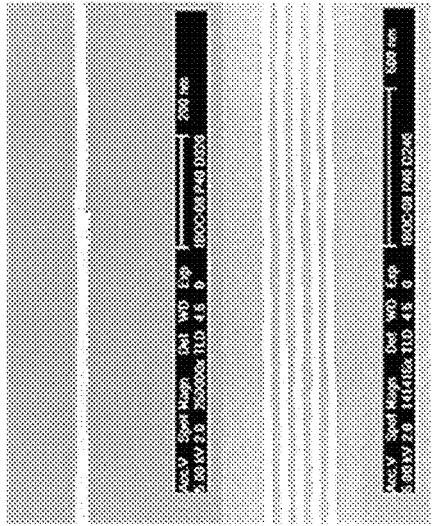
Fig. 8A
Standard process
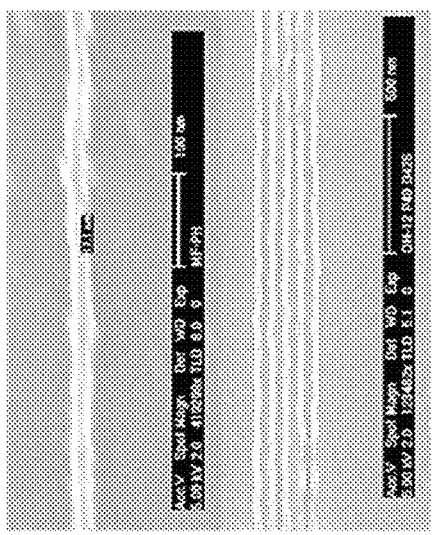
Fig. 8B
Currently disclosed process
Fig. 8

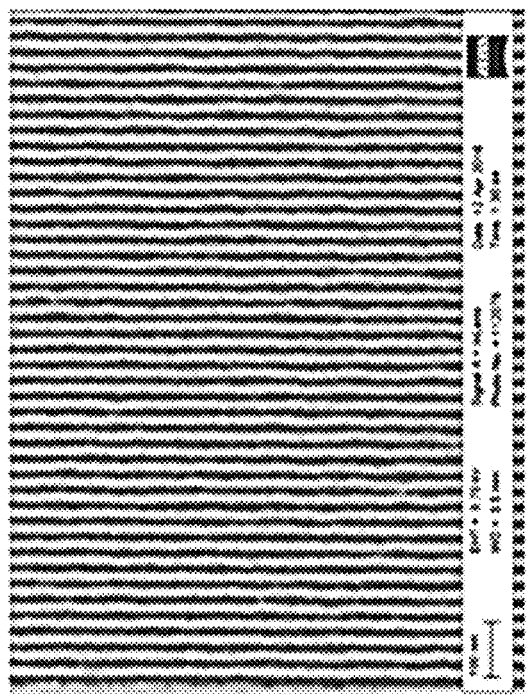
Standard, standard Q
Best dose 40.4mJ/cm²
LWR 2.77nm, LER 3.22nm
Fig. 10B
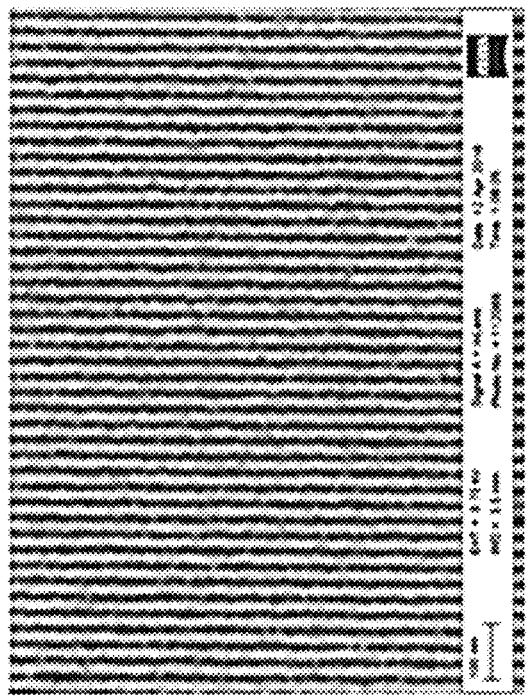
standard formulation (no Quencher)
Best dose 18.9mJ/cm²
LWR 4.38nm, LER 3.82nm
Fig. 10A
Fig. 10

ENHANCED EUV PHOTORESIST MATERIALS, FORMULATIONS AND PROCESSES

REFERENCE TO PRIOR FILED APPLICATION

The present application claims the benefit under 35 U.S.C. 119(e), of U.S. provisional patent application Ser. No. 62/634,827 filed on 24 Feb. 2018, entitled "Enhanced EUV Photoresist Materials, Formulations and Processes" which application is incorporated by reference herein in its entirety.

FIELD OF INVENTION

The present disclosure relates to novel negative-type photoresist composition and methods of their use. The disclosure further relates to multiple trigger photoresist processes which allow for the improvement in contrast, resolution, and/or line edges roughness in some systems without giving up sensitivity. The photoresist compositions and the methods of the current disclosure are ideal for fine patent processing using, for example, ultraviolet radiation, extreme ultraviolet radiation, beyond extreme ultraviolet radiation, X-rays and changed particle. The disclosure further relates to sensitivity enhancing materials useful in the disclosed compositions and methods.

BACKGROUND

EUV (Extreme UV) lithography (EUVL), i.e., at a wavelength of 13.5 nm, is considered to be one of the most promising candidates to replace current 193 nm photolithographic tools for future semiconductor manufacturing needs, smaller and smaller lines and spaces to create smaller and smaller semiconductor features.

To meet the requirements for new EUV-suitable photoresist materials, photoresist manufacturers originally reformulated extant 193 nm resist systems-via the use of formulation adjustments, additives, and photoacid generator (PAG) loading—for EUV use. Although this is a cost-effective approach, it brings line width roughness (LWR), sensitivity, and resolution limitations. LWR is defined by the random fluctuations in the width of a patterned lithographic feature along its length. As photoresists are used to print smaller and smaller patterns, the imperfections in the sidewall become a larger part of the patterning error. Moreover, in several previous studies, these high LWR values have been attributed to the use of polymers for the photoresist matrix. Other contributing factors to the LWR values are shot noise (e.g., flux variations, which are increasingly important because the dose per photon increases substantially in the EUV regime), PAG location in the bulk film (relative to the acid-sensitive protecting group), acid diffusion (or blur) during the chemical amplification process, and the level of developer selectivity. As such, a wide array of new materials have been introduced to support the new technology, but to date no photoresist has been able to simultaneously meet resolution, linewidth roughness and sensitivity (RLS) requirements laid out in the International Technology Roadmap for Semiconductors.

In addition to fulfilling the current resist targets for the next generation of devices; new material platforms must also have the potential to meet the outlined specifications beyond that point, to ensure a useful lifespan for next generation lithography. Traditional chemically amplified resist (CAR) materials have been extended to try and meet this need, but as resolution improvements have led to significant sensitivity reductions, with typical CAR dose to size in the 30-40 mJ/cm2 range at 14 nm halfpitch (hp). In order to increase absorption of EUV photons metal-based resist materials have been heavily investigated and significant work to try to alleviate industry apprehension about the integration of metal resists in to fab-friendly processes undertaken. Doses of less than 25 mJ/cm2 at 16 nm halfpitch and 35 mJ/cm2 at 13 nm hp have been reported. Increasingly industry is calling for new approaches and more radical chemistries to address the RLS issue. An investigation of metal additives to traditional chemically amplified resist to increase optical density has shown increased sensitivity in contact hole patterning from 50 to 43 mJ/cm2 for 22 nm halfpitch contact holes, but at the cost of increased variability in the hole size. The PSCAR process which uses flood UV exposure to amplify the acid produced via an earlier EUV exposure has demonstrated significant reductions in dose requirement from 30 mJ/cm2 at 18 nm hp to 17 mJ/cm2 but with a significant reduction in exposure latitude and increase in LWR also reported.

For several years, extreme-UV (EUV) lithography—has been talked about as the next enabling technology for lithographic patterning. However, a number of technological stumbling blocks (i.e., issues with EUV op-tics, photomask infrastructures, and photoresist materials) have delayed the widespread introduction and implementation of this technique. For instance, the scanner optics that are used in patterning systems and photomasks have been changed from trans-missive optics to reflective optics. This change has proven to be a rather challenging transition, but tremendous progress has now been made and EUV scanner shipments are taking place at an accelerated pace. EUV pellicle development is also progressing (a mitigation step necessary to address defect concerns), and mask infrastructures are being developed at both merchant and in-house mask shops.

Very few commercially available materials have an LWR below about 3 nm. Photoresists that are capable of meeting these LWR parameters need to be developed while improving the photoresists high sensitivity. For instance, most commercial photoresist systems require 35-40mJ/cm2 to print reasonable contact holes (with usable process windows).

As semiconductor dimensions decrease to nanometer scale the conventional thinking about materials, formulations, and mechanisms need to be revisited and re-evaluated.

BRIEF DESCRIPTION OF FIGURES

FIG. 1 shows a chart that relates to the structures of xMT molecules useful in the current disclosure.

FIG. 2 shows alternative xMT molecules useful in the current disclosure.

FIG. 2A shows a dicarbonate

FIG. 2B shows a tetracarbonate.

FIG. 8 compares SEMs of the current process 8B with the standard process 8A.

FIG. 10 further compares SEMs of the current process 10B with the standard process 10A.

SUMMARY OF THE DISCLOSURE

Figure 3:
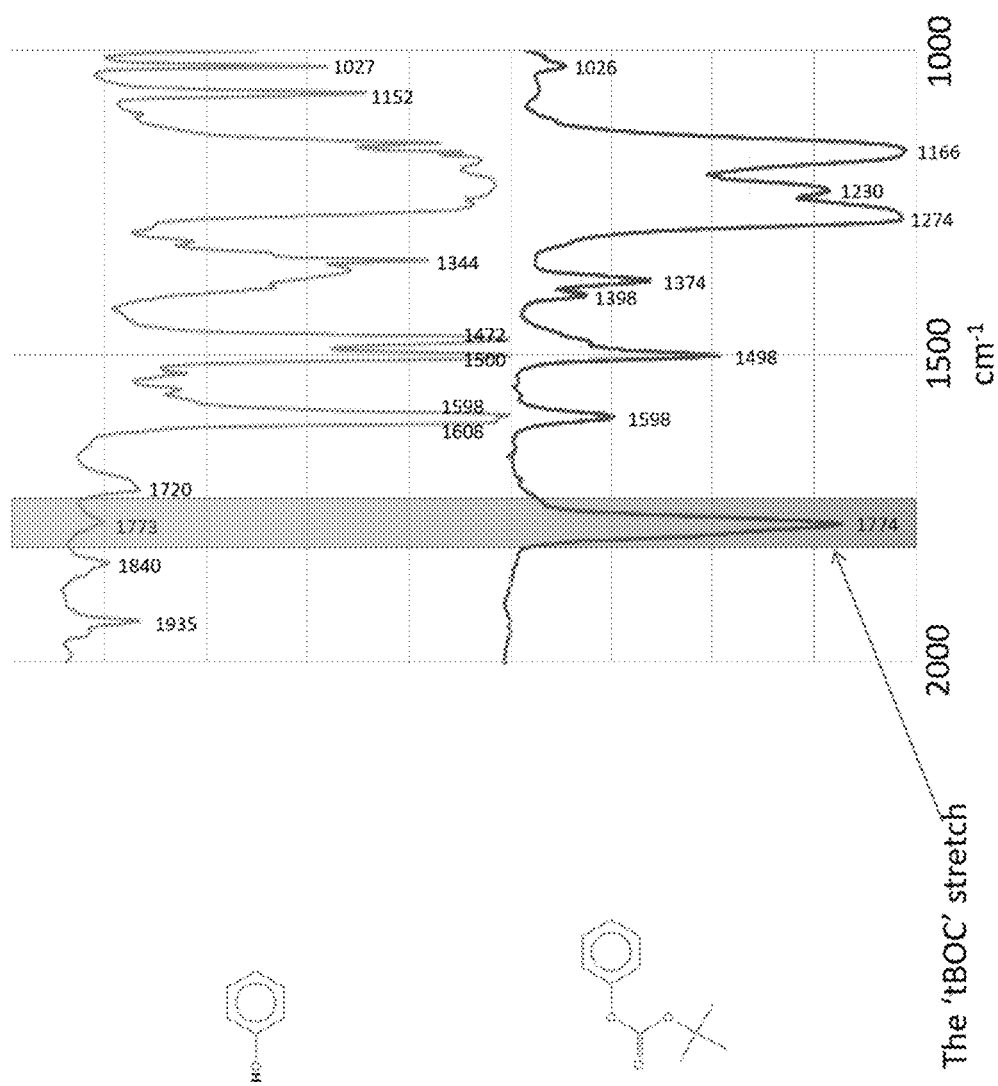
FIG. 3 shows an infrared spectrum of phenol overlaid on an infrared spectrum of t-BOC protected phenol.

Disclosed herein are new materials, new formulations, new additives and new processes which meet and exceed the current requirements of sensitivity, line edge roughness and resolution.

In a first embodiment, disclosed and claimed herein is a method of forming a patterned resist comprising, providing a substrate, applying a multiple trigger resist composition comprising at least one polymer, oligomer or monomer, each comprising two or more crosslinkable functionalities, wherein essentially all the functionalities are attached to acid labile protecting groups, at least one acid activatable crosslinker, at least one photoacid generator, and at least one solvent, wherein the composition is free of any additional acid diffusion control components, heating the coated substrate to form a substantially dried coating to obtain a desired thickness, imagewise exposing the coated substrate to actinic radiation, removing the unexposed areas of the coating using an aqueous developer, a solvent developer or a combination aqueous-solvent developer composition, wherein the remaining photoimaged pattern is optionally heated.

In a second embodiment, disclosed and claimed herein is the above method wherein at least about 90% of the crosslinkable functionalities are attached to acid labile protecting groups.

In a third embodiment, disclosed and claimed herein are any of the above methods wherein the at least one photoacid generator comprises an onium salt compound, a sulfonium salt, a triphenylsulphonium salt, a sulfonimide, a halogen-containing compound, a sulfone, a sulfone imide, a sulfonate ester, a quinone-diazide, a diazomethane, an iodonium salt, an oxime sulfonate, a dicarboxyimidyl sulfate ester, an ylideneaminooxy sulfonic acid ester, a sulfonyldiazomethane, or a mixture thereof which are capable of generating an acid when exposed to at least one of UV, deep UV, extreme UV, x-ray, or e-beam actinic radiation.

In a fourth embodiment, disclosed and claimed herein are any of the above methods wherein the at least one acid activatable crosslinker comprises an aliphatic, aromatic or aralkyl monomer, oligomer, a resin or polymer, comprising at least one of a glycidyl ether, glycidyl ester, an oxetane, a glycidyl amine, a methoxymethyl group, an ethoxy methyl group, a butoxymethy 1 group, a benzyloxymethyl group, dimethylamino methyl group, diethylamino methylamino group, a dialkylolmethyl amino group, a dibutoxymethyl amino group, a dimethylolmethyl amino group, diethylolmethyl amino group, a dibutylolmethyl amino group, a morpholinomethyl group, acetoxymethyl group, benzyloxymethyl group, formyl group, acetyl group, vinylgroup or an isopropenyl group and wherein the acid labile protecting group comprises a tertiary alkoxycarbonyl group.

In a fifth embodiment, disclosed and claimed herein are any of the above methods, wherein the polymer, oligomer or monomer is at least one xMT ester.

In a sixth embodiment, disclosed and claimed herein are any of the above methods, wherein the composition further comprises at least one metal component wherein the metal component exhibits high EUV photoabsorption cross-section, median to high inelastic electron scattering and low to median elastic scattering coefficients.

DETAILED DESCRIPTION OF THE DISCLOSURE

As used herein, the conjunction "and" is intended to be inclusive and the conjunction "or" is not intended to be exclusive unless otherwise indicated. For example, the phrase "or, alternatively" is intended to be exclusive.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As used herein, the terms "dry", "dried" and "dried coating" means having less than 8% residual solvent.

As used herein the term "protected polymer" means a polymer containing a functionality that is capable of crosslinking with a crosslinker, such functionality is protected from reacting with the crosslinker by an acid-labile functionality, so that when exposed to an acid the acid-labile functionally is removed.

As used herein the term metal includes the neutral, unoxidized species as well as any of the typical oxidation states that the metal may be in.

As used herein line edge roughness (LER) refers to areas on the photodefined line that are not in alignment with the rest of the line. This also refers to line geometries and line width roughness.

Traditional semiconductor materials have been based on chemically amplified resist (CAR) materials. In positive systems, the typical formulation includes a photoacid generator (PAG), a polymer which has at least a portion of developer sensitive groups blocked by acid labile groups, and a base quencher. When the coated formulation is exposed to actinic radiation, the PAG emits an acid functionality that reacts with the acid labile group to deprotect the developer sensitive functionality. A developer, traditionally an aqueous base, is then applied which reacts with the now deprotected polymer, to solubilize it and remove it, leaving behind the desired lines, spaces, vias, and the like. Due to the activation energy needed for the radiation generated acid to react with the traditional acid-labile groups to deprotect the developer sensitive groups, a post exposure bake (PEB) is required. Traditionally the developer sensitive group is a phenolic OH which readily reacts with an aqueous base.

Over the years, as finer lines and spaces have become desirable, it has been found that acid migration of the photo-generated acid has become a problem. Here, during PEB, the heat required to deprotect the polymer, has also energized the photo-generated acid causing it to migrate throughout the system, and particularly into undesirable areas such as under the mask, which then deprotects polymers in areas where there has been no exposure to radiation, a result that is undesirable. This is also referred to as "dark reaction". This has caused lines to be thinner than desired (in positive working resists). To compensate for this undesirable effect, it is well known, and generally required, that an ingredient has to be included in resist formulations to reduce the action of migrating acid by combining with it, such ingredients are typically an acid diffusion control agent, generally in the form of a base.

In negative resists based on polymers that contain a reactive functionality that is protected by an acid labile group, similar problems occur. In these resists the reactive functionality, obtained when deprotected by a photogenerated acid, is designed to crosslink with a crosslinker component of the formulation. In these resists the crosslinker is generally either protected with an acid labile protecting group, such as, for example, the hexamethoxymethylmelamines (HMMM) or is activated by a photogenerated, such as for example, epoxies and oxetanes. When these resists undergo exposure and PEB, the exposed area becomes crosslinked and insoluble in the developer which removes the unexposed areas. In these resists, acid migration causes a growing of the lines as the acid diffuses under the mask and starts the crosslinking reaction in undesirable areas, and particularly effect line width growth and roughness as well as line edge roughness.

In the current disclosure we have surprisingly found that removal of the base quench has resulted in improved resolution, line edge roughness and sensitivity, alone or when combined with the other innovations herein presented. This is an unexpected result as all current resists have base quenchers, and research has made it clear, that base quenchers are absolutely necessary to obtain small lithographic features.

We have also found that elimination of the post exposure bake (PEB) results in low thermal migration of the photogenerated acids, allowing for improved line width growth and roughness as well as line edge roughness. Again, this is an unexpected result as all resist processes include a PEB.

Based on these findings, and not to be held to theory, we believe the currently disclosed processes and formulations have captured the physics and chemistry of nanometer features, which up to this point have not been address; as in the macro-world, the issues of line edge roughness and line width growth and roughness were met with the current materials, formulations and processes. However, in the nano-world, these issues have become prominent, and the current technology is incapable of solving the nano-feature issues. We have found that, with the currently available materials, which are based on t-butoxycarbonyl (t-BOC) protection of phenolic OHs, a PEB is required for deprotection.

Additionally, we have found that t-BOC protected phenolic OHs act as a self-quencher in that the photogenerated acid can theoretically coordinate with the molecules of high electron density, such as, for example, any of the oxygens of the carbonate functionality to form a meta-stable complex (one possible example is shown in Scheme 1). When no heat is applied the complex either remains in this metastable state or it reverts back to non-reactive photo products, while with applied heat, the tBOC will deblock the phenol.

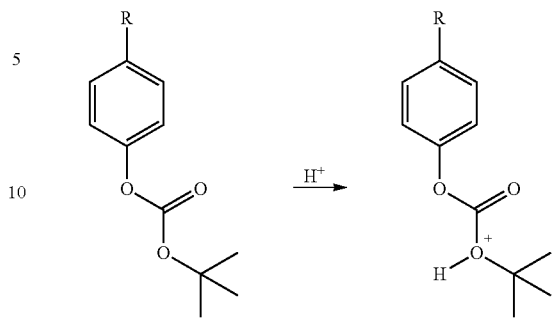

Scheme 1

Substrates useful for the current disclosure are the substrates well known in the art for the manufacture of electronic components, including, for example, silicon substrates which have been coated with other materials such as, for example, silicon dioxide, other oxides, organic and/or inorganic coatings and the like.

The multiple trigger resist composition contains at least one polymer, oligomer or monomer, each comprising two or more crosslinkable functionalities. Such polymer, oligomer and monomer are well known in the art and include, for example, novolac resins, and polyhydroxy-styrene. The two or more crosslinkable functionalities useful for the disclosed method are well known in the industry and include, for example, hydroxy, amino, oximes, and the like. The functionalities in the presence of acid and an acid activated crosslinker will react to crosslink. These functional groups are attached to a polymer, oligomer or monomer containing such groups as, for example, such as an aryl group, which may be a substituted or unsubstituted divalent aromatic group, such aromatic groups include, for example the phenylenes ($-C_6H_4-$), the fused divalent aromatic group, such as, for example, the naphthylenes ($-C_{10}H_6-$), the anthracenylenes ($-C_{14}H_8-$) and the like, as well as the heteroaromatic groups, such as, for example, the nitrogen heterocycles: pyridines, quinolines, pyrroles, indoles, pyrazoles, the triazines, and other nitrogen-containing aromatic heterocycles well known in the arts, as well as the oxygen heterocycles: furans, oxazoles and other oxygen-containing aromatic heterocycles, as well the sulfur containing aromatic heterocycles, such as, for example, thiophenes. Trivalent and tetravalent aromatics can also be used.

The aryl groups may be in the form of an oligomer or a polymer with a molecular weight between about 1000 daltons and 100,000 daltons and higher depending on the desired properties of the cured negative resist pattern, such as etch resistance. Examples include the novolac resins based on phenol, the cresols, the resorcinols, the pyrogallols and the like which also include co-polymers made therefrom. Also, polyhydroxystyrene based polymers and their derivatives or co-polymers may be used in these photoresist compositions.

As above, the crosslinkable functionalities are blocked, or protected, by acid labile protecting groups. Acid labile protecting group, including, for example, substituted methyl groups, 1-substituted ethyl groups, 1-substituted alkyl groups, silyl groups, germyl groups, alkoxycarbonyl group, acyl groups and cyclic acid-dissociable groups. The substituted methyl groups include, for example, the methoxymethyl group, methylthiomethyl group, ethoxy methyl group, ethylthiomethyl group, methoxyethoxy methyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenyl methyl group, triphenylmethyl group, bromobenzyl group, nitrobenzyl group, methoxybenzyl group, methylthiobenzyl group, ethoxy benzyl group, ethylthiobenzyl group, piperonyl group, methoxycarbonylmethyl group, ethoxy carbonylmethyl group, N-propoxy carbonylmethyl group, isopropoxy carbonylmethyl group, N-butoxycarbonylmethyl group and t-butoxycarbonylmethyl group. The 1-substituted ethyl groups include, for example. 1-methoxyethyl group, 1-methylthioethyl group, 1,1-dimethoxyethyl group, 1-ethoxy ethyl group, 1-ethylthioethyl group, 1,1-diethoxy ethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenyl ethyl group, 1-methoxycarbonylethyl group, 1-ethoxy carbonylethyl group, 1-N-propoxy carbonylethyl group, 1-isopropoxy carbonylethyl group, 1-N-butoxycarbonylethyl group and the 1-t-butoxycarbonylethyl group. The 1-substituted alkyl group include the isopropyl group, sec-butyl group, t-butyl group, 1,1-dimethylpropyl group, 1-methylbutyl group and 1,1-dimethylbutyl group.

The acid labile protecting groups may contain silyl functionalities and include, for example, the trimethyl silyl group, ethyldimethylsilyl group, methyldiethylsilyl group, triethylsilyl group, isopropyldimethylsilyl group, methyldiisopropylsilyl group, triisopropylsilyl group, t-butyldimethylsilyl group, methyldi-t-butylsilyl group, tri-t-butylsilyl group, phenyldimethylsilyl group, methyldiphenyl silyl group and triphenylsilyl group. The germyl groups include, for example, the trimethyl germyl group, ethyldimethylgermyl group, methyldiethylgermyl group, triethylgermyl group, isopropyldimethylgermyl group, methyldiisopropylgermyl group, triisopropylgermyl group, t-butyldimethylgermyl group, methyldi-t-butylgermyl group, tri-t-butylgermyl group, phenyldimethylgermyl group, methyldiphenyl germyl group and triphenylgermyl group.

Other acid labile protecting groups include alkoxycarbonyl acid labile protecting groups including, for example, the methoxycarbonyl group, ethoxy carbonyl group, isopropoxy carbonyl group and t-butoxycarbonyl group. Acyl acid labile protecting groups may be used and include, for example, the acetyl group, propionyl group, butyryl group, heptanoyl group, hexanoyl group, valeryl group, pivaloyl group, isovaleryl group, lauroyl group, myristoyl group, palmitoyl group, stearoyl group, oxaryl group, malonyl group, succinyl group, glutaryl group, adipoyl group, piperoyl group, suberoyl group, azelaoyl group, sebacoyl group, acrylyl group, propioloyl group, methacryloyl group, crotonoyl group, oleoyl group, maleoyl group, fumaroyl group, mesaconoyl group, camphoroyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluene sulfonyl group and the mesyl group.

Additional acid labile protecting groups include cyclic acid labile protecting groups and include, for example, the cyclopropyl group, cyclopentyl group, cyclohexyl group, cyclohexanyl group, 4-methoxycyclohexyl group, tetrahydropyranyl group, tetrahydrofuranyl group, tetrahydrothiopyranyl group, tetrahydrothiofuranyl group, 3-bromo tetrahydropyranyl group, 4-methoxy tetrahydropyranyl group, 4-methoxy tetrahydrothiopyranyl group and 3-tetrahydrothiophene-1,1-dioxy group.

Acid activated crosslinkers suitable for the current disclosure constitute compounds able to crosslink with the crosslinkable functionalities mentioned above during the process such that when deprotected to provide for example, a phenol or similar group, the crosslinker will react with the now deprotected —OH group situated on the phenol or similar group. The crosslinkers may be a polymer, an oligomer or a monomer. Not to be held to theory, it is believed that the acid that is generated by exposure to the actinic radiation not only reacts with the acid-labile protecting group of the polymer, oligomer or monomer, but also with the crosslinker as the second trigger to cause a curing reaction when the two materials are in close enough proximity. Such curing reaction decreases the developer solubility of the exposed and now reacted areas to result in a pattern of cured material. Examples of crosslinkers include compounds comprising at least one type of substituted group that possess a cross-linking reactivity with a hydroxy group, such as from a phenol, an amine or similar group of the polymer, oligomer, or monomer. Specific examples of the acid activated crosslinker include the glycidyl ether group, glycidyl ester group, glycidyl amino group, methoxymethyl group, ethoxy methyl group, benzyloxymethyl group, dimethylamino methyl group, diethylamino methyl group, dimethylol amino methyl group, diethylol amino methyl group, morpholino methyl group, acetoxymethyl group, benzyloxy methyl group, formyl group, acetyl group, vinyl group and isopropenyl group.

Examples of compounds having the aforementioned acid activated crosslinker include, for example, bisphenol A-based epoxy compounds, bisphenol F-based epoxy compounds, bisphenol S-based epoxy compounds, novolac resin-based epoxy compound, resole resin-based epoxy compounds, and poly (hydroxystyrene)-based epoxy compounds.

Acid activated crosslinkers based on melamines are useful for the current disclosure and include, for example methylol group-containing melamine compounds, methylol group-containing benzoguanamine compounds, methylol group-containing urea compounds, methylol group-containing phenol compounds, alkoxyalkyl group-containing melamine compounds, alkoxyalkyl group-containing benzoguanamine compounds, alkoxyalkyl group-containing urea compounds, alkoxyalkyl group-containing phenol compounds, carboxymethyl group-containing melamine resins, carboxy methyl group-containing benzoguanamine resins, carboxymethyl group-containing urea resins, carboxymethyl group-containing phenol resins, carboxymethyl group-containing melamine compounds, carboxymethyl group-containing benzoguanamine compounds, carboxymethyl group-containing urea compounds, and carboxymethyl group-containing phenol compounds, methylol group-containing phenol compounds, methoxymethyl group-containing melamine compounds, methoxymethyl group-containing phenol compounds, methoxymethyl group-containing glycol-uril compounds, methoxymethyl group-containing urea compounds and acetoxymethyl group-containing phenol compounds. The methoxymethyl group-containing melamine compounds are commercially available as, for example, CYMEL300, CYMEL301, CYMEL303, CYMEL305 (manufactured by Mitsui Cyanamid), the methoxymethyl group-containing glycol-uril compounds are commercially available as, for example, CYMEL117 4 (manufactured by Mitsui Cyanamid), and the methoxymethyl group-containing urea compounds are commercially available as, for example, MX290 (manufactured by Sanwa Chemicals).

Other acid activated crosslinkers include epoxy crosslinkers. Illustrative of the epoxies employed within the scope of the present invention include polymeric, oligomeric, and monomeric aliphatic and aromatic epoxies, including, for example, cycloaliphatic epoxies, bisphenol A epoxies, 3,4-epoxycyclohexyl methyl 3,4-epoxy cyclohexyl carboxylate, and the like. Also included are epoxy formulations based on glycidyl ethers of para amino phenols as described in U.S. Pat. No. 5,514,729. Other suitable epoxies that may be employed to practice the present invention include, but are not limited to, those derived from bisphenol S, bisphenol F, novolak resins, and the epoxies obtained from the reaction of bisphenol A and epihalohydrins. Such epoxies are described in U.S. Pat. No. 5,623,031. Other suitable epoxies that may be employed to practice the present invention are disclosed in U.S. Pat. Nos. 5,602,193; 5,741,835; and 5,910,548. Further examples of epoxies useful for the current disclosure are the glycidyl ethers and glycidyl esters of novolac based polymers, oligomers, and monomers, and the oxetanes.

The photo acid generators (PAGs) suitable for the multiple trigger negative working photoresist of the current disclosure include onium salt compounds, sulfone imide compounds, halogen-containing compounds, sulfone compounds, ester sulfonate compounds, quinonediazide compounds, and diazomethane compounds. Specific examples of these acid generators are indicated below.

Examples of onium salt compounds include sulfonium salts, iodonium salts, phosphonium salts, diazonium salts and pyridinium salts. Specific examples of onium salt compounds include diphenyl(4-phenylthiophenyl)sulphonium hexafluoroantimonate, 4,4'-bis[diphenylsulfonylphenylsulphide bis hexafluoroantimonate and combinations thereof, triphenylsulfonium nonafluorobutanesulfonate, triphenylsulfonium trifluoromethanesulfonate, triphenylsulfonium pyrenesulfonate, triphenylsulfonium dodecylbenzenesulfonate, triphenylsulfonium p-toluene sulfonate, triphenylsulfonium benzenesulfonate, triphenylsulfonium 10-camphor-sulfonate, triphenylsulfonium octanesulfonate, triphenylsulfonium 2-trifluoromethyl benzenesulfonate, triphenylsulfonium hexafluoroantimonate, triarylsulfonium hexafluoroantimonates, the triarylsulfonium hexafluorophosphates, the triarylsulfonium tetrafluoroborates as well as other tetrafluoroborates, triphenylsulfonium napthalenesulfonate, tri(4-hydroxyphenyl)sulfonium nonafluorobutanesulfonate, tri(4-hydroxyphenyl)sulfoniumtrifluoromethanesulfonate, tri(4-hydroxyphenyl)sulfonium pyrenesulfonate, tri(4-hydroxyphenyl) sulfoniumdodecylbenzenesulfonate, tri(4-hydroxyphenyl)sulfonium p-toluene sulfonate, tri(4-hydroxyphenyl)sulfonium benzenesulfonate, tri(4-hydroxyphenyl)sulfonium10-camphor-sulfonate, tri(4-hydroxyphenyl)sulfonium octanesulfonate, tri(4-hydroxyphenyl)sulfonium 2-trifluoromethylbenzenesulfonate, tri(4-hydroxyphenyl)sulfonium hexafluoroantimonate, tri(4-hydroxyphenyl)sulfonium napthalenesulfonate, diphenyliodonium nonafluorobutanesulfonate, diphenyliodonium trifluoromethanesulfonate, diphenyliodonium pyrenesulfonate, diphenyliodonium dodecylbenzenesulfonate, diphenyliodonium p-toluene sulfonate, diphenyliodonium benzenesulfonate, diphenyliodonium 10-camphor-sulfonate, diphenyliodonium octanesulfonate, diphenyliodonium 2-trifluoromethylbenzenesulfonate, bis(4-t-butylphenyl)iodonium nonafluorobutanesulfonate, bis(4-t-butylphenyl)iodonium trifluoromethanesulfonate, bis(4-t-butylphenyl) iodonium pyrenesulfonate, bis(4-t-butylphenyl)iodonium dodecylbenzenesulfonate, bis(4-t-butylphenyl)iodonium p-toluene sulfonate, bis(4-t-butylphenyl)iodonium benzenesulfonate, bis(4-t-butylphenyl)iodonium 10-camphor-sulfonate, bis(4-t-butylphenyl)iodonium octanesulfonate, bis(4-t-butylphenyl) iodonium 2-trifluoromethylbenzenesulfonate, 4-hydroxy-1-naphthyl tetrahydrothiophenium trifluoromethanesulfonate and 4,7-dihydroxy-1-naphthyl tetrahydrothiophenium trifluoromethanesulfonate.

Specific examples of a sulfone imide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hepto-5-ene-2,3-dicarboxyimide,N-(trifluoromethylsulfonyloxy)-7-oxabicyclo[2.2.1]hepto-5-ene-2,3-dicarboxyimide, N-(trifluoromethylsulfonyloxy) bicyclo[2.2.1]heptane-5,6-oxy-2,3-dicarboxyimide, N-(trifluoromethylsulfonyloxy)naphthylimide, N-(10-camphor-sulfonyloxy)succinimide, N-(10-camphor-sulfonyloxy)phthalimide, N-(10-camphor-sulfonyloxy)diphenyl maleimide, N-(10-camphor-sulfonyloxy)bicyclo[2.2.1]hepto-5-ene-2,3-dicarboxyimide, N-(10-camphor-sulfonyloxy)-7-oxabicyclo[2.2.1]hepto-5-ene-2,3-dicarboxyimide, N-(10-camphor-sulfonyloxy)bicyclo[2.2.1]heptane-5,6-oxy-2,3-dicarboxyimide, N-(10-camphor-sulfonyloxy) naphthylimide, N-(p-toluene sulfonyloxy) succinimide, N-(p-toluene sulfonyloxy)phthalimide, N-(p-toluene sulfonyloxy)diphenyl maleimide, N-(p-toluene sulfonyloxy)bicyclo[2.2.1]hepto-5-ene-2,3-dicarboxyimide, N-(p-toluene sulfonyloxy)-7-oxabicyclo[2.2.1]hepto-5-ene-2,3-dicarboxyimide, N-(p-toluene sulfonyloxy) bicyclo[2.2.1]heptane-5,6-oxy-2,3-dicarboxyimide, N-(p-toluene sulfonyloxy)naphthylimide, N-(2-trifluoromethylbenzenesulfonyloxy)succinimide, N-(2-trifluoromethylbenzenesulfonyloxy)phthalimide, N-(2-trifluoromethylbenzenesulfonyloxy)diphenyl maleimide, N-(2-trifluoromethylbenzenesulfonyloxy)bicyclo[2.2.1] hepto-5-ene-2,3-dicarboxyimide, N-(2-trifluoromethylbenzenesulfonyloxy)-7-oxabicyclo[2.2.1]hepto-5-ene-2,3-dicarboxyimide, N-(2-trifluoromethylbenzenesulfonyloxy) bicyclo[2.2.1]heptane-5,6-oxy-2,3-dicarboxyimide, N-(2-trifluoromethylbenzenesulfonyloxy) naphthylimide, N-(4-fluorobenzenesulfonyloxy)succinimide, N-(4-fluorobenzenesulfonyloxy)phthalimide, N-(4-fluorobenzenesulfonyloxy)diphenyl maleimide, N-(4-fluorobenzenesulfonyloxy)bicyclo[2.2.1]hepto-5-ene-2,3-dicarboxyimide, N-(4-fluorobenzenesulfonyloxy)-7-oxabicyclo[2.2.1]hepto-5-ene-2,3-dicarboxyimide, N-(4-fluorobenzenesulfonyloxy) bicyclo[2.2.1]heptane-5,6-oxy-2,3-dicarboxyimide, N-(4-fluorobenzenesulfonyloxy) naphthylimide, N-(nonafluorobutylsulfonyloxy) succinimide, N-(nonafluorobutylsulfonyloxy)phthalimide, N-(nonafluorobutylsulfonyloxy)diphenyl maleimide, N-(nonafluorobutylsulfonyloxy)bicyclo[2.2.1]hepto-5-ene-2,3-dicarboxyimide, N-(nonafluorobutylsulfonyloxy)-7-oxabicyclo[2.2.1]hepto-5-ene-2,3-dicarboxyimide, N-(nonafluorobutylsulfonyloxy) bicyclo[2.2.1]heptane-5,6-oxy-2,3-dicarboxyimide and N-(nonafluorobutylsulfonyloxy) naphthylimide.

Examples of halogen-containing compounds include, for example, haloalkyl group-containing hydrocarbon compounds and haloalkyl group-containing heterocyclic compounds. Specific examples of halogen-containing compounds include (poly)trichloromethyl-s-triazine derivatives such as phenyl-bis(trichloromethyl)-s-triazine, 4-methoxyphenyl-bis(trichloromethyl)-s-triazine and 1-naphthyl-bis(trichloromethyl)-s-triazine, and 1,1-bis(4-chlorophenyl)-2,2,2-trichloroethane.

Examples of sulfone compounds include, for example, β-ketosulfone and β-sulfonylsulfone, and the α-diazo compounds thereof. Specific examples of the sulfone compounds include phenacyl phenylsulfone, mesitylphenacyl sulfone, bis(phenylsulfonyl)methane, 1,1-bis(phenylsulfonyl) cyclobutane, 1,1-bis(phenylsulfonyl) cyclopentane, 1,1-bis (phenylsulfonyl) cyclo hexane, and 4-trisphenacyl sulfone.

Examples of sulfonate ester compounds include alkylsulfonate esters, haloalkyl sulfonate esters, aryl sulfonate esters sand imino sulfonates. Specific examples of sulfonate ester compounds include benzoin tosylate, pyrogallol tristrifluoromethanesulfonate, pyrogallol trisnonafluorobutanesulfonate, pyrogallol methanesulfonate triester, nitrobenzyl-9,10-diethoxy anthracene-2-sulfonate, α-methylol benzoin tosylate, α-methylol benzoin octanesulfonate, α-methylol benzoin trifluoromethanesulfonate and α-methylol benzoin dodecylsulfonate.

Examples of quinine diazide compounds include compounds containing a 1,2-quinone diazide sulfonyl group such as the 1,2-benzoquinone diazide-4-sulfonyl group, 1,2-naphthoquinone diazide-4-sulfonyl group, 1,2-naphtho quinine diazide-5-sulfonyl group and 1,2-naphthoquinone diazide-6-sulfonyl group. Specific examples of quinone diazide compounds include 1,2-quinone diazidesulfonate esters of (poly) hydroxyphenylaryl ketones such as 2,3,4-trihydroxybenzophenone, 2,4,6-trihydroxybenzophenone, 2,3,4,4'-tetrahydroxybenzophenone, 2,2',3,4-tetrahydroxybenzophenone, 3'-methoxy-2,3,4,4'-tetrahydroxybenzophenone, 2,2', 4,4'-tetrahydroxybenzophenone, 2,2'3,4,4'-pentahydroxybenzophenone, 2,2'3,4,6'-pentahydroxybenzophenone, 2,3,3'4,4',5'-hexahydroxybenzophenone, 2,3'4,4',5',6-hexahydroxybenzophenone; 1,2-quinone diazide sulfonate esters of bis[(poly) hydroxyphenyl]alkanes such as bis(4-hydroxyphenyl) methane, bis(2,4-dihydroxyphenyl) methane, bis(2,3,4-trihydroxyphenyl) methane, 2,2-bis(4-hydroxyphenyl) propane, 2,2-bis(2,4-dihydroxyphenyl) propane and 2,2-bis(2,3,4-trihydroxyphenyl) propane; 1,2-quinone diazide sulfonate esters of (poly) hydroxytriphenylalkanes such as 4,4'-dihydroxytriphenylmethane, 4,4',4''-trihydroxytriphenylmethane, 2,2',5,5'-tetramethyl-2'',4,4'-trihydroxytriphenylmethane, 3,3',5,5'-tetramethyl-2'',4,4'-trihydroxytriphenylmethane, 4,4',5,5'-tetramethyl-2,2',2''-trihydroxytriphenylmethane, 2,2',5,5'-tetramethyl-4,4',4'''-trihydroxytriphenylmethane, 1,1,1-tris (4-hydroxyphenyl) ethane, 1,1-bis(4-hydroxyphenyl)-1-phenylethane, 1,1-bis (4-hydroxyphenyl)-1-[4-{1-(4-hydroxyphenyl)-1-methylethyl}phenyl] ethane, 1,1,3-tris (2,5-dimethyl-4-hydroxyphenyl) propane, 1,1,3-tris (2,5-dimethyl-4-hydroxyphenyl) butane and 1,3,3-tris (2,5-dimethyl-4-hydroxyphenyl) butane; and 1,2-quinone diazide sulfonate esters of (poly) hydroxyphenylflavans such as 2,4,4-trimethyl-2',4',7-trihydroxy-2-phenylflavan and 2,4,4-trimethyl-2',4',5',6',7-pentahydroxy-2-phenylflavan.

Specific examples of diazomethane compounds include bis(trifluoromethylsulfonyl)diazomethane, bis(cyclohexylsulfonyl)diazomethane, bis(phenylsulfonyl) diazomethane, bis(p-toluene sulfonyl) diazomethane, methylsulfonyl-p-toluene sulfonyldiazomethane, 1-cyclohexylsulfonyl-1-(1, 1-dimethylethylsulfonyl)diazomethane and bis(1,1-dimethylethylsulfonyl)diazomethane.

The compositions of the current disclosure may contain one or more of the above mentioned photoacid generators.

Examples of suitable solvents for the current disclosure include ethers, esters, etheresters, ketones and ketoneesters and, more specifically, ethylene glycol monoalkyl ethers, diethylene glycol dialkyl ethers, propylene glycol monoalkyl ethers, propylene glycol dialkyl ethers, acetate esters, hydroxyacetate esters, lactate esters, ethylene glycol monoalkylether acetates, propylene glycol monoalkylether acetates, alkoxyacetate esters, (non-)cyclic ketones, acetoacetate esters, pyruvate esters and propionate esters. Specific examples of these solvents include ethylene glycol monomethyl ether, ethylene glycol monoethyl ether, ethylene glycol monopropyl ether, ethylene glycol monobutyl ether, diethylene glycol dimethyl ether, diethylene glycol diethyl ether, diethylene glycol dipropyl ether, diethylene glycol dibutyl ether, methylcellosolve acetate, ethyl cellosolve acetate, propylene glycol monomethyletheracetate, propylene glycol monoethyletheracetate, propylene glycol monopropyletheracetate, isopropenyl acetate, isopropenyl propionate, methylethyl ketone, cyclohexanone, 2-heptanone, 3-heptanone, 4-heptanone, 2-hydroxypropionate ethyl, 2-hydroxy-2-methylpropionate ethyl, ethoxy acetate ethyl, hydroxyacetate ethyl, 2-hydroxy-3-methyl methylbutyrate, 3-methoxybutylacetate, 3-methyl-3-methoxybutylacetate, 3-methyl-3-methoxybutyl propionate, 3-methyl-3-methoxybutyl butylate, ethyl acetate, propyl acetate, butyl acetate, methyl acetoacetate, ethyl acetoacetate, methyl 3-methoxypropionate, ethyl 3-methoxy propionate, 3-ethoxy propionate methyl and 3-ethoxy propionate ethyl. The aforementioned solvents may be used independently or as a mixture of two or more types. Furthermore, at least one type of high boiling point solvent such as benzylethyl ether, dihexyl ether, diethylene glycol monomethyl ether, diethylene glycol monoethyl ether, acetonylacetone, isoholon, caproic acid, capric acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenylcellosolve acetate may be added to the aforementioned solvent.

In a typical resist formulation various additives for acid diffusion control agents to retard acid from migrating into unexposed areas of the coating are added. We have found that with the proper selection of acid labile protecting group and the proper selection of the acid activatable crosslinker agent, such acid diffusion agents are not required. That is, the acid labile protecting group and the acid activated crosslinkers will complex with the photogenerated acid without migration. Not all acid labile protecting groups or acid activatable crosslinkers will complex with the photoacid and will thus require as acid diffusion control agent.

The crosslinkable functionalities are all blocked by the acid labile protecting groups from about 90% to about 100% blocked. The acid labile groups are selected to have the property of being capability of complexing with the photogenerated acid.

The photoresist compositions can be coated onto substrate such as a silicon wafer or a wafer coated with silicon dioxide, aluminum, aluminum oxide, copper, nickel, any of a number of semiconductor materials or nitrides or other substrates well known the semiconductor industry, or a substrate having thereon an organic film, such as, for example, a bottom layer anti-reflective film or the like. The photoresist compositions are applied by such processes as spin coating, curtain coating, slot coating, dip coating, roller coating, blade coating and the like. After coating, the solvent is removed to a level wherein the coating can be properly exposed. In some cases a residual of 5% solvent may remain in the coating while in other cases less than 1% is required. Drying can be accomplished by hot plate heating, convection heating, infrared heating and the like. The coating is imagewise exposed through a mark containing a desired pattern.

Radiation suitable for the described photoresist compositions include, for example, ultraviolet rays (UV), such as the bright line spectrum of a mercury lamp (254 nm), a KrF excimer laser (248 nm), and an ArF excimer laser (193 nm), extreme ultraviolet (EUV) such as 13.5 nm from plasma discharge and synchrotron light sources, beyond extreme ultraviolet (BEUV) such as 6.7 nm exposure, X-ray such as synchrotron radiation. Ion beam lithography and charged particle rays such as electron beams may also be used.

In the current method embodiments, following exposure, the exposed coated substrate does not undergo a post exposure baked, thus preventing the photogenerated acid from migrating, thus preventing dark reactions that cause line edge roughness and other undesirable pattern defects.

The unexposed areas are next moved using a developer. Such developers generally include organic solvents. The develop solvent is less aggressive than the solvent that was used in preparing the photoresist composition.

After development a final baking step may be included to further enhance the curing of the now exposed and developed pattern. The heating process may be, for example, from about 30 to about 300° C. for about 10 to about 120 seconds and may be accomplished by hot plate heating, convection heating, infrared heating and the like.

In a further disclosure we have developed new materials, xMT, that are useful for the compositions of the disclosed method. These materials are described in U.S. Pat. Nos. 9,122,156, 9,229,322 and 9,519,215 which are incorporated herein by reference including those of the general formulae:

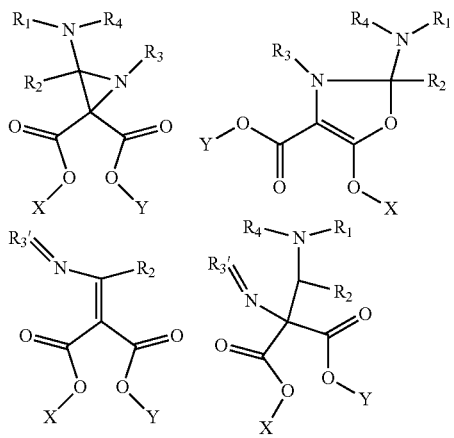

wherein at least one of X or Y comprises

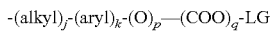

wherein j, k, p, and q take the values in the table of FIG. 1; wherein alkyl is a branched or unbranched, substituted or unsubstituted divalent alkyl chain of 1-16 carbon atoms having 0-16 heteroatoms substituted into the chain, aryl is a substituted or unsubstituted divalent phenyl group, divalent heteroaromatic group, or divalent fused aromatic or fused heteroaromatic group, and wherein LG is a tertiary alkyl or tertiary cycloalkyl group, an alicyclic group, a ketal or cyclic aliphatic ketal, or an acetal.is a leaving group.

These materials have surprisingly been shown to improve resolution, sensitivity and line geometries, such as line edge roughness and sensitivity. Other more newly developed xMT materials useful in the current disclosure have surprisingly provided even better improvement in LER and sensitivity, which includes those in FIG. 2. Both variants are designed to reduce LER by stiffening the molecule before and after the photoreaction wherein they crosslink with added crosslinkers. One variant, FIG. 8B, includes additional functional groups designed to increase photosensitivity. xMT materials useful in the current disclosure are based on the reaction products of protected malonic acid esters and amidines as described in the aforementioned references.

Metal components useful in the current disclosure include those metals which exhibit high EUV photoabsorption cross-section, medium to high inelastic electron scattering and low to medium elastic scattering coefficients, including, for example, metals chosen from the periodic table of elements of columns 3 through 17 and rows 3 through 6, which includes Scandium, Titanium, Vanadium, Chromium, Manganese, Iron, Cobalt, Nickel, Copper, Zinc, Gallium, Germanium, Arsenic, Selenium, Bromine, Yttrium, Zirconium, Niobium, Molybdenum, Technetium, Ruthenium, Rhodium, Palladium, Silver, Cadmium, Indium, Tin, Antimony, Tellurium, Iodine, the Lanthanides, Hafnium, Tantalum, Tungsten, Rhenium, Osmium, Iridium, Platinum, Gold, Mercury, Lead, Bismuth, Polonium, and columns 13-17 row 3 which includes Aluminum, Silicon, Phosphorus, Sulfur and Chlorine or a salt or coordinated complex or these chosen metals, a chosen metal containing a monomeric, oligomeric or polymeric ligand. These materials are described in U.S. Pat. No. 9,632,409 which is incorporated herein by reference.

In some embodiments the exposed resist may undergo a post exposure bake step. This optional step includes a selected temperature for a selected length of time. The time and temperature are chosen to optimize the exposure cure prior to development, depending on the aggressiveness of the developer, and also depending on the strength of the complex resulting from the complexation of the photogenerated acid with the components, such as the at least one polymer, oligomer or monomer, each comprising two or more crosslinkable functionalities, wherein at least 90% of the functionalities are attached to acid labile protecting groups, and/or the at least one acid activatable crosslinker.

EXAMPLES

Figure 4:
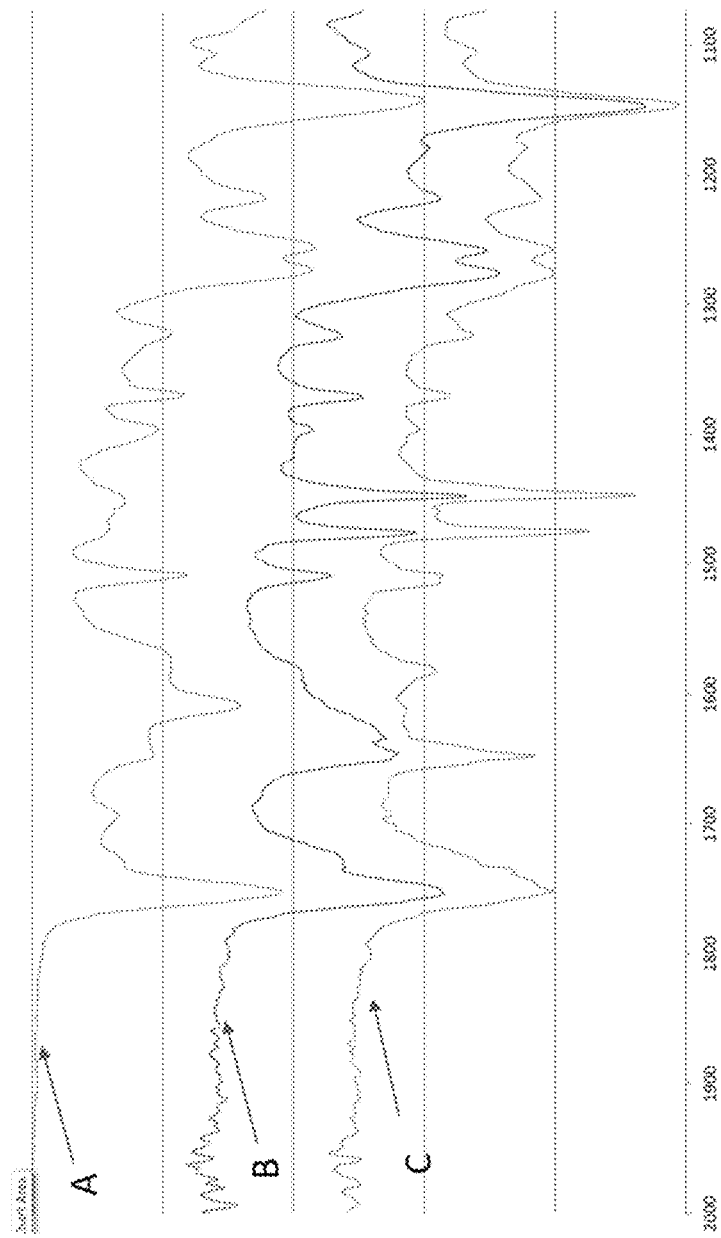
FIG. 4 shows infrared spectra comparing t-BOC phenol A, t-BOC phenol plus PAG and t-BOC phenol plus PAG after UV exposure and 15-minute hold tine C.
Figure 5:
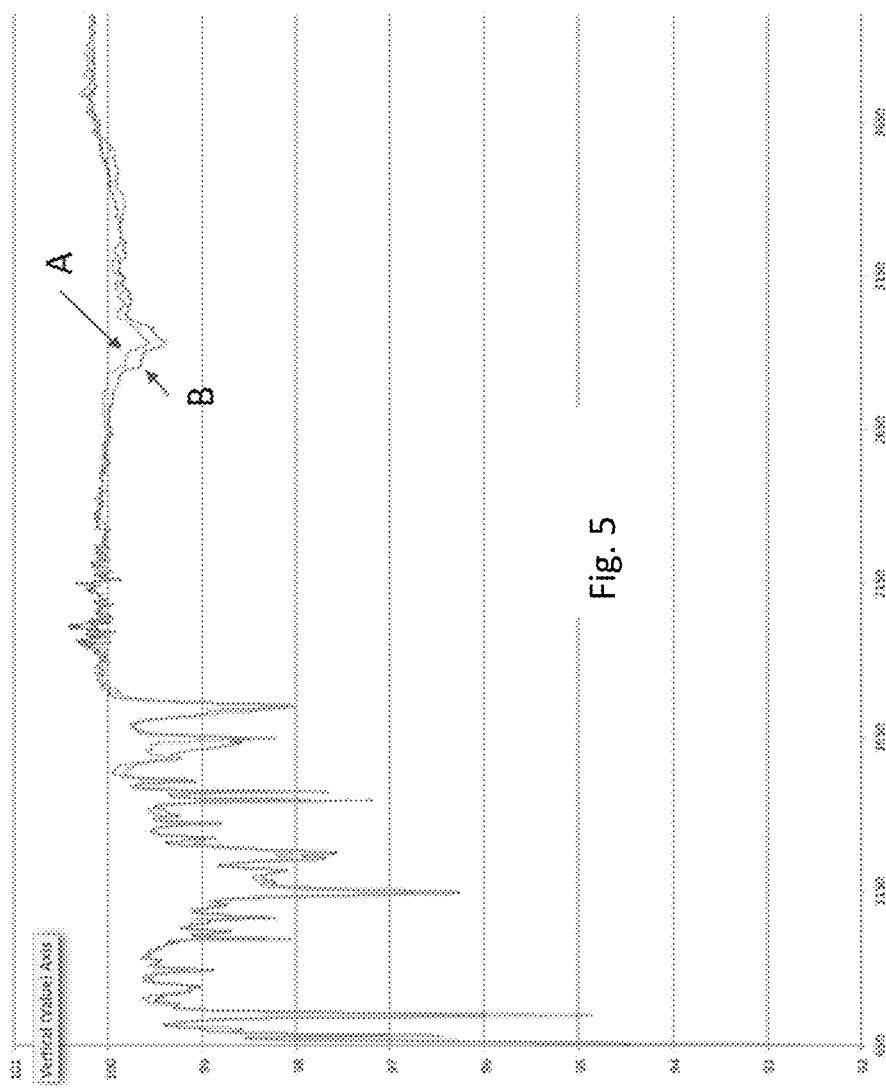
FIG. 5 shows infrared spectra of t-BOC phenol plus PAG after UV exposure A and t-BOC phenol plus PAG after UV exposure and 15-minute hold B.

A tBOC protected phenol was formulated with a PAG (photo acid generator) and exposure to EUV radiation. After holding for 15 minutes, little to no tBOC reacted with the photogenerated acid and no phenolic OHs result. FIG. 3 shows the IR spectrum of phenol and tBOC protected phenol, showing the prominent stretch at 1774 cm$^{-1}$ of the carbonyl moiety of the tBOC functionality. FIG. 4 shows that after UV exposure and a 15-minute hold time, no reduction carbonyl of the tBOC functionality has occurred. The 1774 cm$^{-1}$ prominent stretch for the t-BOC functionality is essentially the same. Further evidence is shown in FIG. 5 where no OH appears in the IR after exposure of the protected phenol and PAG and after a 15-minute hold, as would be expected if the tBOC had reacted with the photo generated acid to deblock the phenolic oxygen as evidenced by the little to no change at the approximate 3000 cm$^{-1}$ stretch where an —OH would strongly absorb.

Figure 6:
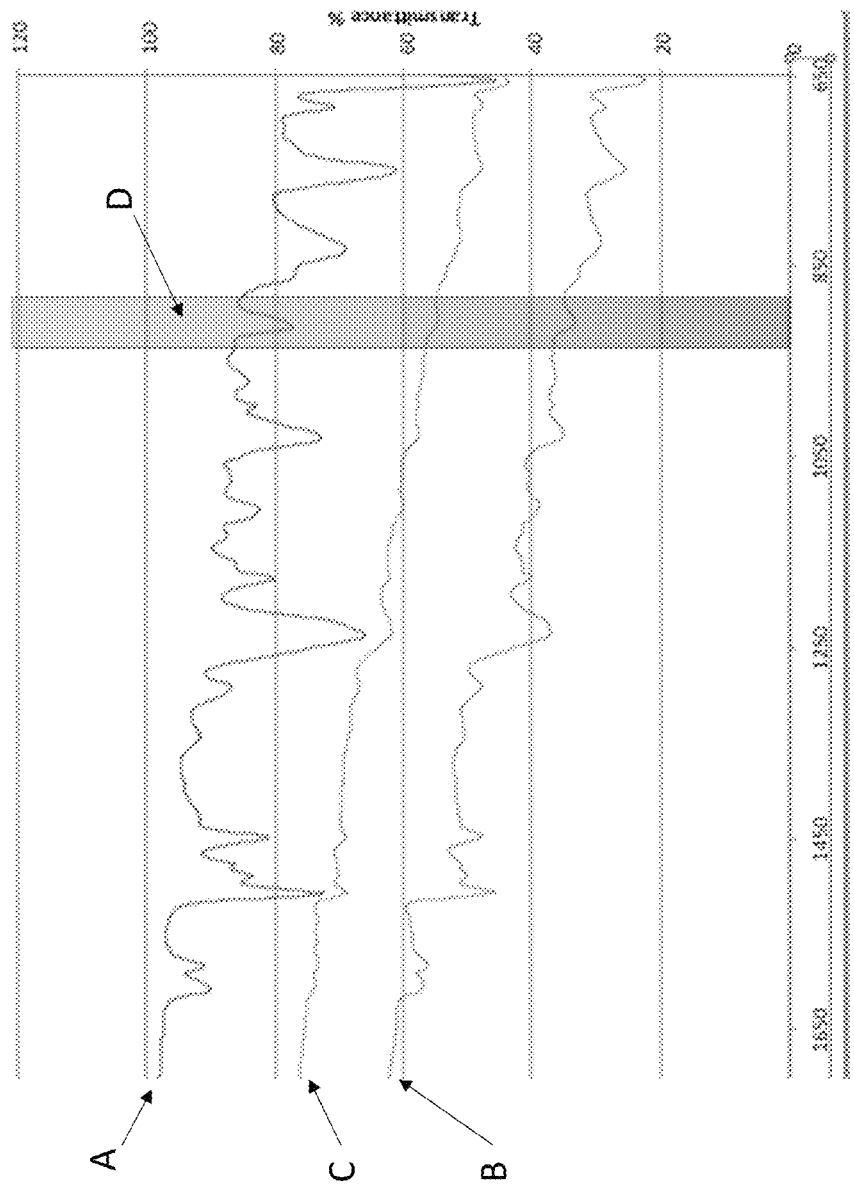
FIG. 6 shows infrared spectra of an epoxy crosslinker plus PAG A, the epoxy crosslinker plus PAG after UV exposure and 15-minute hold B, epoxy crosslinker plus PAG after UV exposure and Post Exposure Bake C, also showing the ir absorption band of the epoxy functionality D.

In addition, we surprisingly found that typical crosslinkers that are found in negative photoresist, such as, for example, epoxies, also need heat to complete their curing step. FIG. 6 shows the infrared spectrum of a typical epoxy crosslinker blended with a typical PAG, line A. It can be seen that after UV exposure some of the epoxies have reacted, line B, but not until a PEB has the reaction completed, line C.

Not to be held to theory we believe, based on the foregoing, that the tBOC functionality and the epoxy act as self-quenching materials, in that the photogenerated acids will coordinate with the oxygen of both tBOC protected material and the crosslinker, or with any other positions on these molecules that have high electron density.

Figure 7:
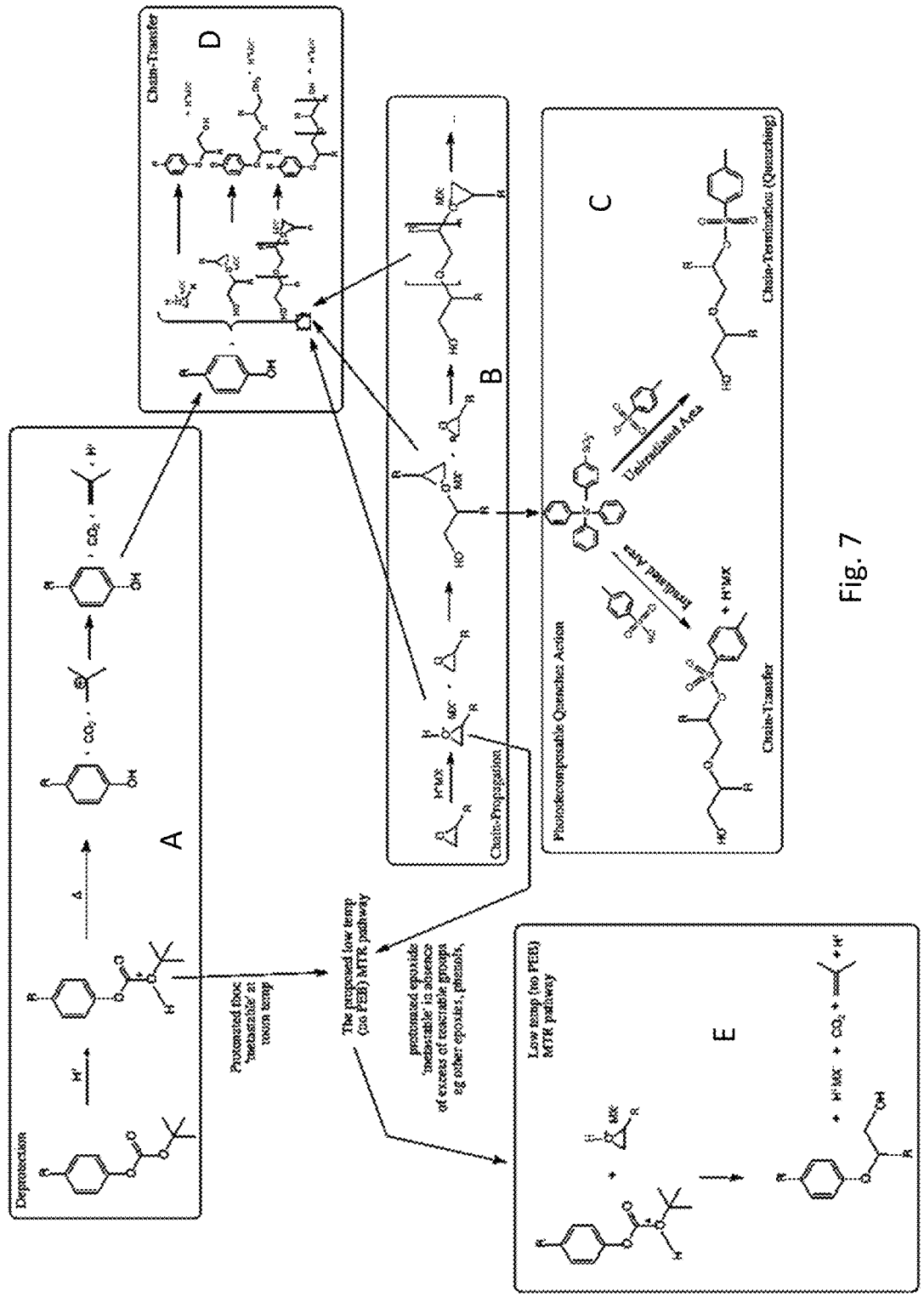
FIG. 7 shows proposed mechanisms of various processes A-E including the current process.

The proposed mechanisms are shown in FIG. 7, A-E. This schematic illustrates the newly disclosed process. In FIG. 7A, the photogenerated acid will form a meta-stable complex with the tBOC and only with heat will the phenol result. The photogenerated acid will also form a metastable complex with the crosslinker as shown in FIG. 7B. However, some of the epoxy will open up and partially crosslink as shown in FIG. 7B. It is believed that at ambient temperature, only small chains result, ending with chain termination by chain transfer mechanisms with photo products from the PAG, as shown in FIG. 7C. The mechanism of the typical photoresists, FIG. 7D, wherein a PEB has been applied, the tBOC deprotects the phenol which then reacts with the propagating chain from the heat-activated chain propagating crosslinker. Because there is little control of the reaction once a PEB is applied, the chain and crosslinking, as well as acid migration, creates line edge roughness, and line width growth and roughness. In the new unexpected process, FIG. 7E, the meta-stable materials remain unreacted until both the tBOC complex and the crosslinker complex come into close enough proximity so that they can react, and in the case of an epoxy, the chain will start to propagate. Because there needs to be two events happening at the same time, the multiple trigger process, the geometry of the lines and spaces are controlled. FIG. 8A shows SEMs of a standard photoresist containing additional acid diffusion control ingredients using typical methods compared to the resist using a currently disclosed, non PEB composition and process, shown in FIG. 8B. The improvement in line and space geometry can readily be seen. Photoacids will activate matrix molecules but the reaction will only proceed where a base molecule and a crosslinker are simultaneously activated in close proximity to each other. Thus, surprisingly a new process which eliminates the PEB has been found to give surprisingly superior results in the photoresist formulations.

In certain embodiments of the current disclosure high Z metals and/or non-metals and the xMT materials can each be used alone in the disclosed resist composition or they can be combined.

Example 1

Figure 9:
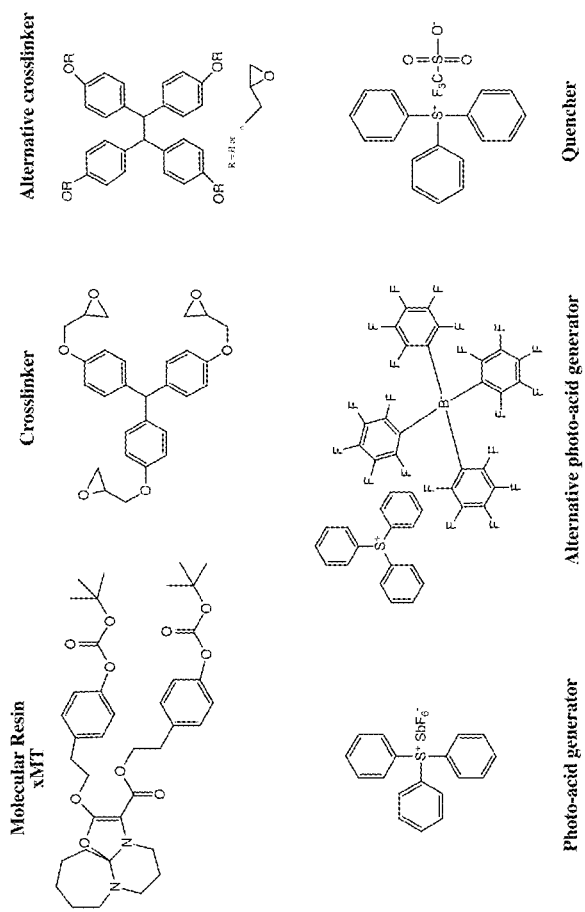
FIG. 9 shows the chemical structures of the components used in the examples.

Materials of the examples are shown on FIG. 9.
Composition 1
The xMT molecular resin compound in FIG. 9 was admixed with the molecular crosslinker and the photo-acid generator in ethyl lactate in the ratio of 0.2:2:1 weight ratio. The composition was spin coated on proprietary carbon coated silicon wafer and heated on a hot plate at 75° C. for 5 min to give a film of approximately 25 nm. The coated wafer is then imagewise exposed to synchrotron based EUV light at 13-14 nm wavelength and post exposure baked at 90° C. for 3 min. The unexposed areas are removed by puddle development in a 50:50 blend of monochlorobenzene and isopropyl alcohol for 20 sec followed by an isopropyl alcohol rinse. The unexposed areas are removed by puddle development in a 50:50 blend of monochlorobenzene and isopropyl alcohol for 20 sec followed by an isopropyl alcohol rinse.

Composition 2
Composition 1 was repeated but with the addition of 2.5% quencher.

The results are shown in FIG. 10 comparing Composition 1 (FIG. 10A) with Composition 2 (FIG. 10B). As can be seen in FIG. 10A the resist with no quencher had higher sensitivity 18.9 mJ/cm$^2$ vs. 40.4 mJ/cm$^2$, while at the same time the line edge roughness was essentially the same. At equal exposures Composition 1 has a line edge roughness about 50% higher than Composition 2.

Example 2

Figure 11:
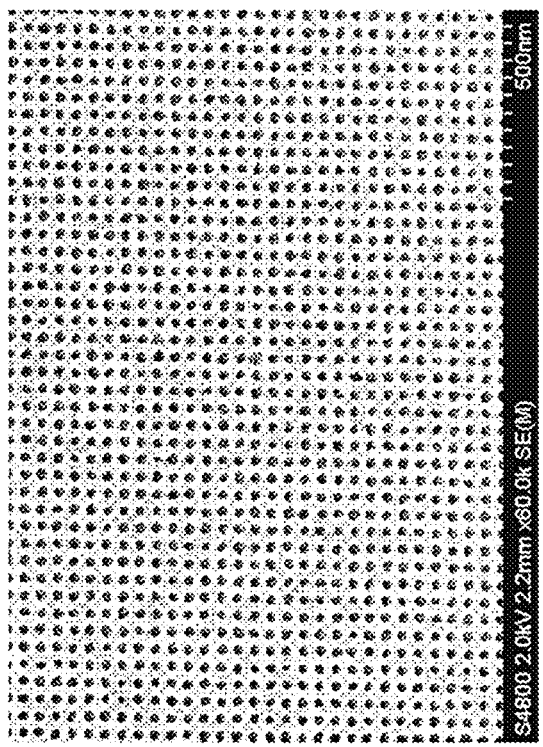
FIG. 11 shows an SEM of a pattern of contact holes using the current compositions and current process.

Very few commercially available materials have an LWR below about 3 nm and higher sensitivity photoresists need to be developed. For instance, most commercial photoresist systems require 35-40mJ/cm$^2$ to print reasonable contact holes (with usable process windows). Composition 1 was used to print a sample patterned with contact holes (see FIG. 11) using the Microfield Exposure Tool at Lawrence Berkeley National Laboratory, which is the world's highest resolution EUV lithography tool (0.3 numerical aperture). In particular, the patterning dose for this exposure was less than 17mJ/cm$^2$ and the critical dimension target was dense 25 nm contact hole structures.

The results show complete resolution of the holes using the current process with the disclosed compositions. When a post exposure bake was used, holes were either not resolved or were of a much poorer resolution.

We claim:
1. A method of forming a patterned resist comprising:
   a. providing a substrate,
   b. applying a multiple trigger resist composition comprising:
      i. at least one polymer comprising two or more crosslinkable functionalities, wherein essentially all the functionalities are attached to acid labile protecting groups,
      ii. at least one acid activatable crosslinker,
      iii. at least one photoacid generator,
      iv. at least one solvent, and
      v. at least one xMT ester comprising a compound of one of the following structures:

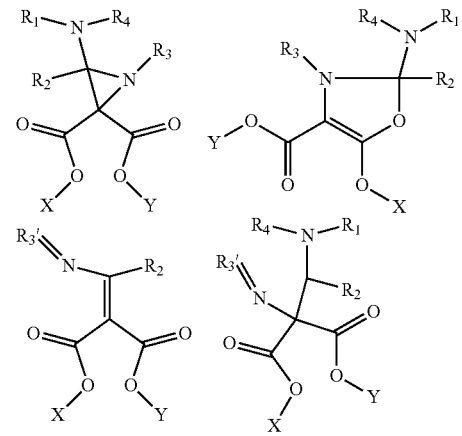

wherein at least one of X or Y comprises

-(alkyl)j-(aryl)k-(O)$_p$—(COO)$_q$-LG wherein j, k, p, and q take the values in the following table:

| -alkyl- j | -aryl- k | —O— p | —COO— q |
|---|---|---|---|
| 1 | 1 | 1 | 1 |
| 1 | 1 | 0 | 1 |
| 1 | 1 | 1 | 0 |
| 1 | 0 | 0 | 1 |
| 1 | 0 | 1 | 0 |
| 0 | 1 | 1 | 1 |
| 0 | 1 | 0 | 1 |
| 0 | 1 | 1 | 0 |
| 0 | 0 | 0 | 1 | wherein alkyl is a branched or unbranched, substituted or unsubstituted divalent alkyl chain of 1-16 carbon atoms having 0-16 heteroatoms substituted into the chain, aryl is a substituted or unsubstituted divalent phenyl group, divalent heteroaromatic group, or divalent fused aromatic or fused heteroaromatic group, and wherein LG is a tertiary alkyl or tertiary cycloalkyl group, an alicyclic group, a ketal or cyclic aliphatic ketal, or an acetal is a leaving group, c. heating the coated substrate to form a substantially dried coating to obtain a desired thickness, d. imagewise exposing the coated substrate to actinic radiation, e. removing the unexposed areas of the coating using an aqueous developer, a solvent developer or a combination aqueous-solvent developer composition, wherein the remaining photoimaged pattern is optionally heated and wherein the exposed resist may be selectively heated prior to development and wherein the composition is free of any additional acid diffusion control components.

2. The method of claim 1, wherein the xMT ester comprises a compound one of the following structures:

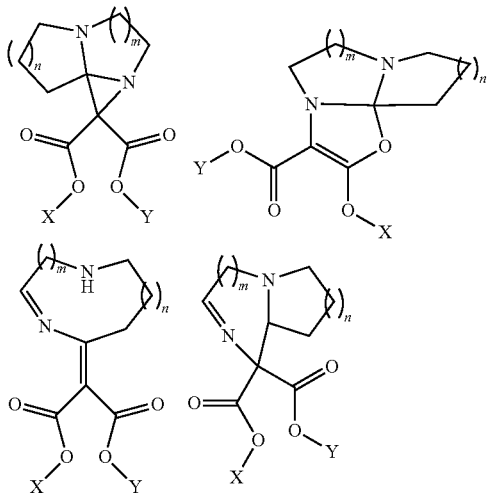

wherein at least one of X or Y comprises -(alkyl)j-(aryl)k-(O)p-(COO)q-LG wherein j, k, p, and q take the values in the following table:

| -alkyl- j | -aryl- k | —O— p | —COO— q |
|---|---|---|---|
| 1 | 1 | 1 | 1 |
| 1 | 1 | 0 | 1 |
| 1 | 1 | 1 | 0 |
| 1 | 0 | 0 | 1 |
| 1 | 0 | 1 | 0 |
| 0 | 1 | 1 | 1 |
| 0 | 1 | 0 | 1 |
| 0 | 1 | 1 | 0 |
| 0 | 0 | 0 | 1 | wherein alkyl is a branched or unbranched, substituted or unsubstituted divalent alkyl chain of 1-16 carbon atoms having 0-16 heteroatoms substituted into the chain, aryl is a substituted or unsubstituted divalent phenyl group, divalent heteroaromatic group, or divalent fused aromatic or fused heteroaromatic group, and wherein LG is a tertiary alkyl or tertiary cycloalkyl group, an alicyclic group, a ketal or cyclic aliphatic ketal, or an acetal is a leaving group.

3. The method of claim 1 wherein the at least one photoacid generator comprises an onium salt compound, a sulfonium salt, a triphenylsulphonium salt, a sulfonimide, a halogen-containing compound, a sulfone, a sulfone imide, a sulfonate ester, a quinone-diazide, a diazomethane, an iodonium salt, an oxime sulfonate, a dicarboxyimidyl sulfate ester, an ylideneaminooxy sulfonic acid ester, a sulfonyldiazomethane, or a mixture thereof which are capable of generating an acid when exposed to at least one of UV, deep UV, extreme UV, x-ray, or e-beam actinic radiation.

4. The method of claim 3, wherein the at least one acid activatable crosslinker comprises an aliphatic, aromatic or aralkyl monomer, oligomer, a resin or polymer, comprising at least one of a glycidyl ether, glycidyl ester, an oxetane, a glycidyl amine, a methoxymethy 1 group, an ethoxy methyl group, a butoxymethy 1 group, a benzyloxymethyl group, dimethylamino methyl group, diethylamino methyl amino group, a dialkylolmethyl amino group, a dibutoxymethyl amino group, a dimethylolmethyl amino group, diethylolmethyl amino group, a dibutylolmethyl amino group, a morpholinomethyl group, acetoxymethyl group, benzyloxymethyl group, formyl group, acetyl group, vinyl group or an isopropenyl group.

5. The method of claim 1, wherein the composition further comprises at least one metal component wherein the metal component exhibits high EUV photoabsorption cross-section, median to high inelastic electron scattering and low to median elastic scattering coefficients.

6. The method of claim 5, wherein the at least one metal is chosen from the periodic table of elements of columns 3 through 17 and rows 3 through 6, which includes Scandium, Titanium, Vanadium, Chromium, Manganese, Iron, Cobalt, Nickel, Copper, Zinc, Gallium, Germanium, Arsenic, Selenium, Bromine, Yttrium, Zirconium, Niobium, Molybdenum, Technetium, Ruthenium, Rhodium, Palladium, Silver, Cadmium, Indium, Tin, Antimony, Tellurium, Iodine, the Lanthanides, Hafnium, Tantalum, Tungsten, Rhenium, Osmium, Iridium, Platinum, Gold, Mercury, Lead, Bismuth, Polonium, and columns 13-17 row 3 which includes Aluminum, Silicon, Phosphorus, Sulfur and Chlorine or a salt, coordinated complex, a metal containing a monomeric, oligomeric or polymeric ligand.

7. The method of claim 6, wherein the at least one acid activatable crosslinker comprises an aliphatic, aromatic or aralkyl monomer, oligomer, a resin or polymer, comprising at least one of a glycidyl ether, glycidyl ester, an oxetane, a glycidyl amine, a methoxymethy 1 group, an ethoxy methyl group, a butoxymethy 1 group, a benzyloxymethyl group, dimethylamino methyl group, diethylamino methylamino group, a dialkylolmethyl amino group, a dibutoxymethyl amino group, a dimethylolmethyl amino group, diethylolmethyl amino group, a dibutylolmethyl amino group, a morpholinomethyl group, acetoxymethyl group, benzyloxymethyl group, formyl group, acetyl group, vinyl group or an isopropenyl group.

* * * * *